US009846606B2

(12) United States Patent
Chen

(10) Patent No.: US 9,846,606 B2
(45) Date of Patent: Dec. 19, 2017

(54) STORAGE DEVICE CALIBRATION METHODS AND CONTROLLING DEVICE USING THE SAME

(71) Applicant: MEDIATEK INC., Hsin-Chu (TW)

(72) Inventor: Chun-Liang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 670 days.

(21) Appl. No.: 14/535,335

(22) Filed: Nov. 7, 2014

(65) Prior Publication Data
US 2016/0132379 A1    May 12, 2016

(51) Int. Cl.
| | |
|---|---|
| *G01R 31/20* | (2006.01) |
| *G06F 11/07* | (2006.01) |
| *G06F 11/14* | (2006.01) |
| *G01R 31/3185* | (2006.01) |
| *G01R 1/04* | (2006.01) |
| *G01R 31/265* | (2006.01) |
| *G06F 11/22* | (2006.01) |
| *H04L 1/00* | (2006.01) |
| *G06F 11/00* | (2006.01) |
| *G11C 11/00* | (2006.01) |
| *G11C 29/00* | (2006.01) |
| *G01R 31/28* | (2006.01) |
| *G01R 31/04* | (2006.01) |

(52) U.S. Cl.
CPC ........ *G06F 11/0772* (2013.01); *G01R 1/0491* (2013.01); *G01R 31/265* (2013.01); *G01R 31/318511* (2013.01); *G06F 11/00* (2013.01); *G06F 11/0787* (2013.01); *G06F 11/1492* (2013.01); *G06F 11/22* (2013.01); *G11C 11/00* (2013.01); *G11C 29/00* (2013.01); *H04L 1/00* (2013.01); *G01R 1/0466* (2013.01); *G01R 31/043* (2013.01); *G01R 31/2868* (2013.01); *G01R 31/2874* (2013.01)

(58) Field of Classification Search
CPC ................ G01R 1/0491; G01R 31/265; G01R 31/318511; G01R 1/0466; G01R 31/043; G01R 31/2868; G01R 31/2874; G01R 31/2893
USPC ......... 324/71, 378, 403, 415, 425, 500, 537, 324/757.01, 757.04, 757.13
See application file for complete search history.

(56) References Cited

U.S. PATENT DOCUMENTS

| | | | |
|---|---|---|---|
| 2007/0192173 A1* | 8/2007 | Moughler | G06Q 10/06 705/7.21 |
| 2008/0183444 A1* | 7/2008 | Grichnik | G05B 17/02 703/2 |
| 2014/0279759 A1* | 9/2014 | Yang | G06F 3/0671 706/12 |

* cited by examiner

Primary Examiner — Jermele M Hollington
Assistant Examiner — Raul Rios Russo
(74) Attorney, Agent, or Firm — Winston Hsu

(57) ABSTRACT

A calibration method includes transmitting first data comprising a calibration data and a first checksum to the storage device according to each of a plurality of training parameter sets; recording a plurality of error indicators respectively which are corresponding to the plurality of training parameter sets and from the storage device; and identifying one of the plurality of training parameter sets as a predetermined parameter set according to the plurality of error indicators respectively corresponding to the plurality of training parameter sets; wherein each error indicator indicates whether transmitting the first data according to the corresponded training parameter set is successful.

17 Claims, 7 Drawing Sheets

STORAGE DEVICE CALIBRATION METHODS AND CONTROLLING DEVICE USING THE SAME

BACKGROUND

The present invention relates to storage device calibration methods and controlling device using the same, and more particularly, to storage device calibration methods for performing transmission calibrations and controlling device using the same.

Double-Data-Rate Fourth Generation Synchronous Dynamic Random Access Memory (DDR4 SDRAM, hereinafter DDR4) is the next generation of DRAM memories, promising faster operating speeds than DDR3, as well as greater power saving and reduction features. The standard operating voltage has been reduced from 1.5V for DDR3 to 1.2V for DDR4, which makes DDR4 more suitable for mobile and handheld devices that require greater power efficiency.

In an initialization stage or during an operation stage of the DDR4, a controller of the DDR4 is required to perform transmission/reception (TX/RX) calibrations to prevent data transmissions or data receptions between the controller and the DDR4 from abnormally operating. When performing the TX calibration, the controller needs to write testing data to the DDR4 and read the testing data stored in the DDR4. Via comparing the testing data wrote (i.e. transmitted) to the DDR4 and the testing data read (i.e. received) from the DDR4, the controller is able to determine whether the data transmission successes. However, the result of the RX calibration would affect the process of the TX calibration since the TX calibration needs to read data from the DDR4. For example, the TX calibration would be forced to be interrupted and restarted if the result of the RX calibration indicates that the data reception fails, resulting in additional time consumption. As can be seen from the above, the prior art needs to be improved.

SUMMARY

In order to solve the above problem, the present invention discloses storage device calibration methods of performing transmission calibrations and control device using the same.

The present invention discloses a calibration method for a controlling device of a storage device, the calibration method comprising transmitting first data comprising a calibration data and a first checksum to the storage device according to each of a plurality of training parameter sets; recording a plurality of error indicators which are respectively corresponding to the plurality of training parameter sets and from the storage device; and identifying one of the plurality of training parameter sets as a predetermined parameter set according to the plurality of error indicators respectively corresponding to the plurality of training parameter sets; wherein each error indicator indicates whether transmitting the first data according to the corresponded training parameter set is successful.

The present invention further discloses a calibration method for a controlling device of a storage device, the calibration method comprising transmitting first run-time data to a storage device according to a predetermined parameter set; periodically transmitting second run-time data comprising at least one run-time checksum to the storage device according to at least one of a plurality of run-time parameter sets; recording a plurality of run-time error indicators which are corresponding to the plurality of run-time parameter sets and from the storage device; and adjusting the predetermined parameter set according to the plurality of run-time error indicators corresponding to the plurality of run-time parameter sets.

The present invention further discloses a controlling device for a storage device, the controlling device comprising an interface module, for transmitting data and signals between the controlling device and the storage device; a data providing module, for providing a first data comprising a calibration data and a first checksum; and a control module, for obtaining a plurality of training parameter sets; wherein the controlling device transmits, through the interface module, the first data comprising the calibration data and the first checksum to the storage device according to each of the plurality of training parameter sets; wherein the controlling device receives, through the interface module, a plurality of error indicators which are respectively corresponding to the plurality of training parameter sets, and each error indicator indicates whether transmitting the first data according to the corresponded training parameter set is successful; wherein the control module identifies one of the plurality of training parameter sets as a predetermined parameter set according to the plurality of error indicators.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
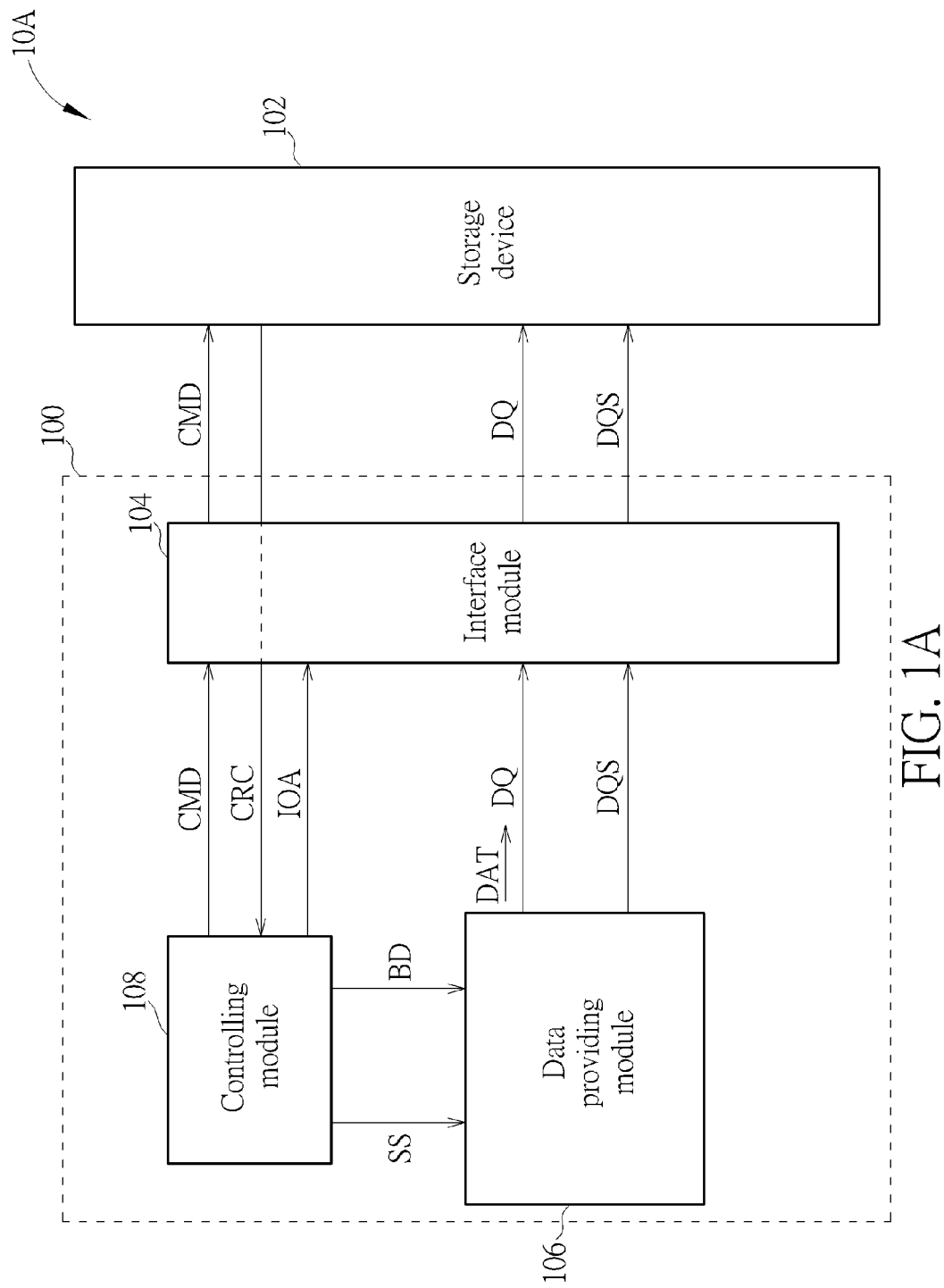
FIG. 1A is a schematic diagram of an electronic system according to an example of the present invention.

Please refer to FIG. 1A, which is a schematic diagram of an electronic system 10A according to an example of the present invention. The electronic system 10A may be an electronic product comprising a storage device. For example, the electronic system 10A may be a mobile or a handheld device such as a laptop, a personal computer, a tablet and a smart phone. As show in FIG. 1A, the electronic system 10A comprises a controlling device 100 and a storage device 102, wherein the storage device 102 may be any data storage device such as a read-only memory (ROM), flash memory, random-access memory (RAM), hard disk and optical data storage device, and is not limited herein. For example, the storage device 102 may be a Double-Data-Rate Fourth Generation Synchronous Dynamic Random Access Memory (DDR4 SDRAM). When the electronic system 10A requires the controlling device 100 to perform a transmission calibration (hereinafter TX calibration) from the controlling device 100 to the storage device 102, the controlling device 100 transmits calibration data to the storage device 102 according to each of training parameter sets. After receiving the calibration data from the controlling device 100, the storage device 102 generates an alert signal CRC to indicate whether the data transmission corresponding to each of the training parameter sets successes. The controlling device 100 records the alert signal CRC corresponding to each training parameter set as an error indicator and accordingly identifies one of the training parameter sets as a predetermined parameter set utilized for subsequent data transmissions. In other words, the controlling device 100 determines whether the data transmissions from the controlling device 100 to the storage device 102 success by checking the alert signal CRC instead of reading data from the storage device 102. Without performing the read operations during the process of the TX calibration, the time of performing the TX calibration is shortened and the operations of the TX calibration is not affected by results of reception calibrations (hereinafter RX calibration), therefore.

In details, the controlling device 100 comprises an interface module 104, a data providing module 106 and a controlling module 108. The interface module 104 is utilized for transmitting data and signals between the controlling device 100 and the storage device 102. The data providing module 106 is utilized for generating a data signal DQ and a strobe signal DQS, which are transmitted to the storage device 102 via the interface module 104. The controlling module 108 is utilized for obtaining the plurality of training parameter sets storing with or accessible to the controlling module 108. When the storage device 102 is under initialization (e.g. when the electronic system 10A boots up or reboots), the controlling module 108 generates and transmits a command signal CMD to the storage device 102 via the interface module 104, to enable a transmission training function and a write checking function of the storage device 102. In an example, the write checking function is a write Cyclic Redundancy Check (CRC) function of the storage device 102. The command signal CMD also indicates a reference voltage to the storage device 102. Further, the controlling module 108 generates a bit delay signal BD, a sampling strobe signal SS to the data providing module 106, and an input/output (I/O) ability signal IOA to the interface module 104, to control different variables of the data transmission from the controlling device 100 to the storage device 102. In this example, the reference voltage relates to the voltage that the storage device 102 determines digital codes of the received data signal DQ; the bit delay signal BD relates to the time periods between bits of the data signal DQ; the sampling strobe signal SS relates to the timing that the storage device 102 samples the received data signal DQ (i.e. the sampling strobe signal SS relates to the relationships between the data signal DQ and the strobe signal DQS); and the I/O ability signal IOA relates to the driving ability of the transmitted signals (i.e. the data signal DQ and the strobe signal DQS) of the controlling device 100.

After the transmission calibration function and the write checking function of the storage device 102 are enabled, the controlling module 108 adjusts the reference voltage (VREFDQ), the bit delay signal BD, the sampling strobe signal SS, and the I/O ability signal IOA according to one of the training parameter set (e.g. a first training parameter set). Since the write checking function is enabled, the data providing module 106 generates a first checksum according to the calibration data and packages the calibration data and the first checksum, to generate and transmit data DAT to the interface module 104 via the data signal DQ. For example, the data DAT may comprise the calibration data and a header of the first checksum. The delays between the bits of the data signal DQ is adjusted according to the bit delay signal BD by the data providing module 106. In addition, the data providing module 106 generates the strobe signal DQS and adjusts the alignment relationship between the data signal DQ and the strobe signal DQS according to the sampling strobe signal SS. Next, the interface module 104 transmits the data signal DQ and the strobe signal DQS from the data providing module 106 to the storage device 102, whereby the driving abilities of the data signal DQ and the strobe signal DQS is adjusted according to the I/O ability signal IOA from the controlling module 108. For example, driving currents (e.g. a pull-high current or a pull-low current) of the interface module 104 may be adjusted according to the I/O ability signal IOA.

After the storage device 102 receives the data signal DQ and the strobe signal DQS, the storage device 102 samples the data signal DQ according to the strobe signal DQS, to generate testing data according to the reference voltage VREFDQ. In order to determine whether the testing data and the calibration data are the same (i.e. whether the data transmission performed according to the first training parameter set successes), the storage device 102 generates a second checksum according to the testing data and compares the first checksum with the second checksum. If the first checksums and the second checksum are the same, the storage device 102 adjusts the alert signal CRC to a high logic level (i.e. '1') to indicate that the data transmission transmitted according to the first training parameter set successes; and if the first checksums and the second checksum are different, the storage device 102 adjusts the alert signal CRC to a low logic level (i.e. '0') to indicate that the data transmission transmitted according to the first training parameter set fails. The controlling module 108 records the alert signal CRC corresponding to the first training parameter set as a first error indicator.

After acquiring the first error indicator, the controlling module 108 adjusts the reference voltage, the bit delay signal BD, the sampling strobe signal SS, and the I/O ability signal IOA according to another training parameter set (e.g. a second training parameter set) and accordingly records the alert signal CRC as a second error indicator. Different from the data transmission of the first training parameter set, at least one of parameters (e.g. the reference voltage, the delays between bits of the data signal DQ, the alignment relationship between the data signal DQ and the strobe signal DQS, and the driving abilities of the data signal DQ and strobe signal DQS) is adjusted in the data transmission of the second training parameter set. Via repeating transmitting the data DAT with the first checksum according to each of the training parameter sets, the controlling module 108 sequentially acquires a plurality of error indicators corresponding to the training parameter sets, and identifies one of the training parameter sets as the predetermined parameter set according to the error indicators corresponding to the training parameter sets. The controlling device 100 therefore can perform the data transmission to the storage device 102 with a comfortable margin according to the predetermined parameter set.

Figure 1B:
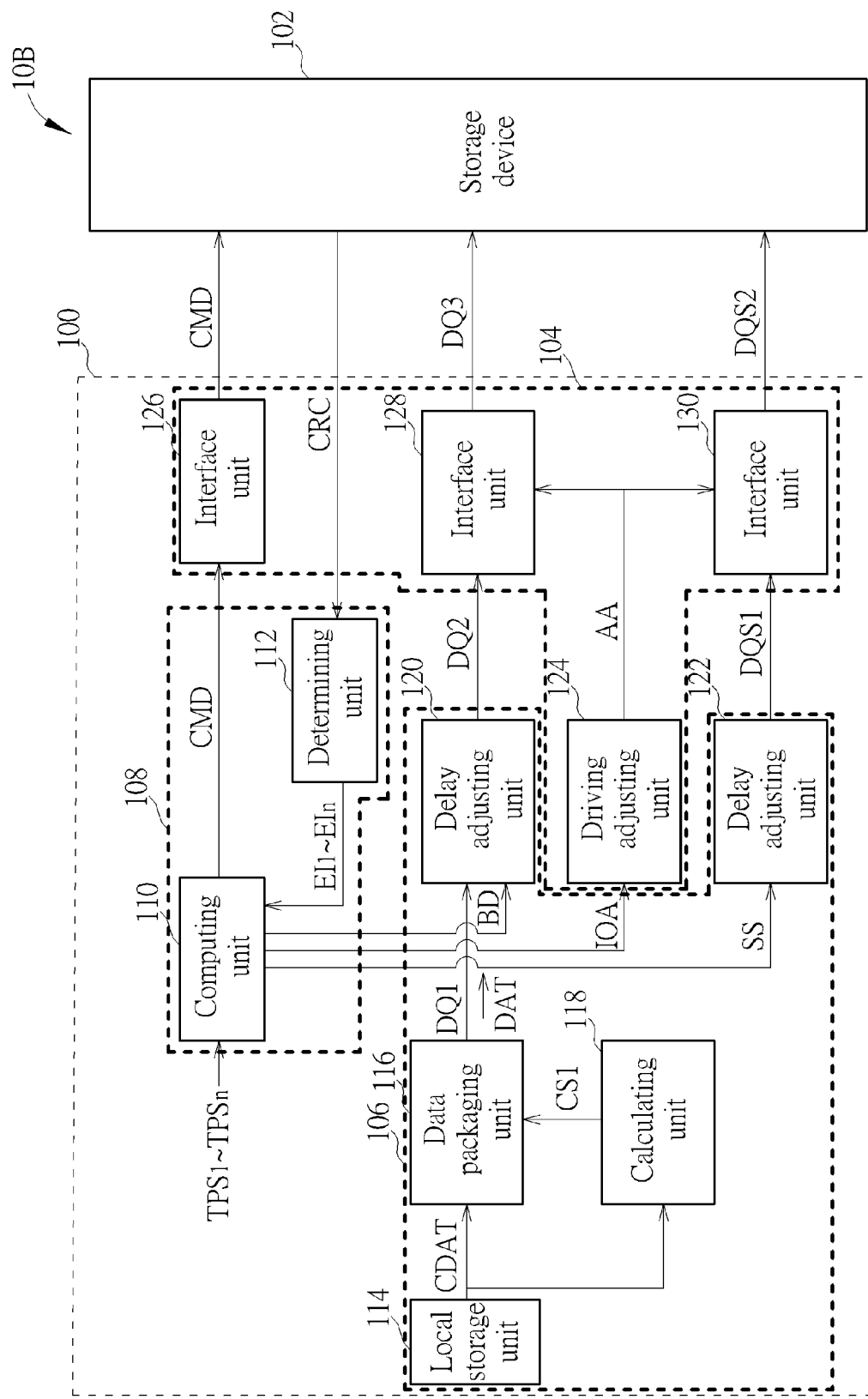
FIG. 1B is a schematic diagram of an electronic system according to another example of the present invention.

Please refer to FIG. 1B, which is a schematic diagram of an electronic system 10B according to an example of the present invention. The electronic system 10B is an implementation of the electronic system 10A shown in FIG. 1A, thus the components and signals with the similar functions use the same symbols. In FIG. 1B, the controlling module 108 comprises a computing unit 110 and a determining unit 112; the data providing module 106 comprises a local storage unit 114, a data packaging unit 116, a calculating unit 118 and delay adjusting units 120, 122; and the interface module 104 comprises a driving adjusting unit 124 and interface units 126, 128, 130. When the storage device 102 is under initialization (e.g. when the electronic system 10B boots up), the electronic system 10B requires the controlling device 100 to perform the TX calibration. The computing unit 110 transmits the command signal CMD to the storage device 102 via the interface unit 126, to enable the transmission training function and the write checking function of the storage device 102. The command signal CMD also indicates the reference voltage (VREFDQ) to the storage device 102. The computing unit 110 further generates the bit delay signal BD to the delay adjusting unit 120, a sampling strobe signal SS to the delay adjusting unit 122, and an input/output (I/O) ability signal IOA to the driving adjusting unit 124, to control different variables of the data transmission from the controlling device 100 to the storage device 102.

When the controlling device 100 starts to perform the TX calibration, the computing unit 110 adjusts the reference voltage VREFDQ, the bit delay signal BD, the sampling strobe signal SS, and the I/O ability signal IOA according to the training parameter set $TPS_1$. Since the write checking function is enabled, the calculating unit 118 generates the checksum CS1 according to the calibration data CDAT read from the local storage unit 114 and the data packaging unit 116 packages the calibration data CDAT and the checksum CS1, to generate and transmit the data DAT to the delay adjusting unit 120 via a data signal DQ1. For example, the data DAT may comprise the calibration data CDAT and a header of the checksum CS1. Next, the delay adjusting unit 120 adjusts the delays between bits of the data signal DQ1 according to the bit delay signal BD, to generate a data signal DQ2. The interface unit 126 receives the data signal DQ2 and accordingly generates the data signal DQ3 to the storage device 102, wherein the driving ability of the data signal DQ3 is adjusted by a signal AA which is generated by the driving adjusting unit 124 and according to the I/O ability signal IOA. For example, the interface unit 126 may adjust the driving currents (e.g. a pull-high current or a pull-low current) of the interface unit 126 according to the signal AA. On the other hand, the delay adjusting unit 122 generates a strobe signal DQS1 corresponding to the sampling strobe signal SS. The strobe signal DQS1 is utilized for indicating timings of sampling the data signal DQ2. The alignment relationship between the data signal DQ2 and the strobe signal DQS1 is adjusted according to the sampling strobe signal SS. The interface unit 130 receives the strobe signal DQS1 and generates the strobe signal DQS2 to the storage device 102. Similarly, the driving ability of the strobe signal DQS2 is also adjusted by the signal AA.

After the storage device 102 receives the data signal DQ3 and the strobe signal DQS2, the storage device 102 samples the data signal DQ3 according to the strobe signal DQS2, to generate the testing data TDAT (not shown) according to the reference voltage VREFDQ. In order to determine whether the testing data TDAT and the calibration data CDAT are the same (i.e. whether the data transmission performed according to the training parameter set $TPS_1$ successes), the storage device 102 generates the checksum CS2 (not shown) according to the testing data TDAT and compares the checksum CS1 with the checksum CS2. If the checksums CS1 and CS2 are the same, the storage device 102 adjusts an alert signal CRC to a high logic level (i.e. '1') to indicate that the data transmission transmitted according to the training parameter set $TPS_1$ successes; and if the checksums CS1 and CS2 are different, the storage device 102 adjusts the alert signal CRC to a low logic level (i.e. '0') to indicate that the data transmission transmitted according to the training parameter set $TPS_1$ fails. The determining unit 112 records the alert signal CRC corresponding to the training parameter set $TPS_1$ as the error indicator $EI_1$.

After acquiring the error indicator $EI_1$, the computing unit 110 adjusts the reference voltage VREFDQ, the bit delay signal BD, the sampling strobe signal SS, and the I/O ability signal IOA according to the training parameter set $TPS_2$, and accordingly records the alert signal CRC from the storage device 102 as the error indicator $EI_2$. Different from the data transmission of the training parameter set $TPS_1$, at least one of parameters (e.g. the reference voltage VREFDQ, the delays between bits of the data signal DQ2, the alignment relationship between the data signal DQ2 and the strobe signal DQS1, and the driving abilities of the data signal DQ3 and strobe signal DQS2) is adjusted in the data transmission of the training parameter set $TPS_2$. Via repeating transmitting the data DAT with the checksum CS1 according to the training parameter set $TPS_3$-$TPS_n$, the computing unit 110 sequentially acquires the error indicators $EI_3$-$EI_n$, and then identifies one of the training parameter sets $TPS_1$-$TPS_n$ as the predetermined parameter set PPS according to the error indicators $EI_1$-$EI_n$. According to the predetermined parameter set PPS, the controlling device 100 performs the data transmission to the storage device 102 with a comfortable margin.

In an example, the controlling device 100 is required to perform the TX calibration of the reference voltage VREFDQ. In such a condition, the training parameter sets $TPS_1$-$TPS_n$ comprise reference voltage parameters PV1-PVn corresponding to the reference voltage VREFDQ with different voltage values. For example, the voltage value of the reference voltage VREFDQ may monotonically increase from the voltage value corresponding to the reference voltage parameter PV1 to that of the reference voltage parameter PVn. When the TX calibration of the reference voltage VREFDQ is performed, the bit delay signal BD, the sampling strobe signal SS and I/O ability signal IOA keep the same. That is, the delays between the bits of the data signal DQ2, the alignment relationship between the data signal DQ2 and the strobe signal DQS1, and the driving abilities of the data signal DQ3 and strobe signal DQS2 remain the same during the TX calibration of the reference voltage VREFDQ.

Via repeating transmitting the data DAT with the checksum CS1 to the storage device 102 according to the reference voltage parameters PV1-PVn of the training parameter sets $TPS_1$-$TPS_n$ (i.e. according to the reference voltage VREFDQ with different voltage values), the error indicators $EI_1$-$EI_n$ can be acquired and the predetermined parameter set PPS can be accordingly identified. For example, if the error indicators $EI_1$-$EI_n$ indicate that the data transmissions of the training parameter sets $TPS_1$-$TPS_{i-1}$, $TPS_{j+1}$-$TPS_n$ fails and the data transmissions of the training parameter sets $TPS_i$-$TPS_j$ success, the computing unit 110 may select training parameter set $$TPS_{\frac{1+j}{2}}$$

as the predetermined parameter set PPS. As a result, the reference voltage VREFDQ would have the maximum voltage margin when the controlling device 100 performs the data transmission with the storage device 102 according to the predetermined parameter set PPS.

The controlling device 100 may train different parameters of data transmission from the controlling device 100 to the storage device 102 via changing the parameters in the training parameter sets $TPS_1$-$TPS_n$. For example, the training parameter sets $TPS_1$-$TPS_n$ may have bit delay parameters PBD1-PBDn corresponding to different delays between bits of the signal transmitted to the storage device 102 (e.g. the data signals DQ2 and DQ3) when the controlling device 100 is required to perform the TX calibration of the bit delay signal BD; the training parameter sets $TPS_1$-$TPS_n$ may have sampling parameters PSS1-PSSn corresponding to different alignment relationships between the data signal DQ2 and the strobe signal DQS1 (i.e. the data signal DQ3 and the strobe signal DQS2) when the controlling device 100 is required to perform the TX calibration of the sampling strobe signal SS; and the training parameter sets $TPS_1$-$TPS_n$ may have I/O ability parameters PIO1-PIOn corresponding to different driving abilities of the interface units 118 and 120 when the controlling device 100 is required to perform the TX calibration of the I/O ability signal IOA.

According to different applications and design concepts, the TX calibration performed by the controlling device 100 may train multiple parameters simultaneously. In other words, each of the training parameter sets $TPS_1$-$TPS_n$ may have multiple parameters of the reference voltage VREFDQ, the bit delay signal BD, the sampling strobe signal SS and/or the I/O ability signal IOA, but is not limited thereto. For example, the controlling device 100 may simultaneously perform the TX calibrations of reference voltage VREFDQ and the driving ability of the interface units 118 and 120. In such a condition, the training parameter sets $TPS_1$-$TPS_n$ would have the reference voltage parameters PV1-PVn and the I/O ability parameters PIO1-PIOn, respectively. In another example, the controlling device 100 may simultaneously perform the TX calibrations of reference voltage VREFDQ, the delays between the bits of the signal transmitted to the storage device 102 and the driving ability of the interface units 118 and 120. The training parameter sets $TPS_1$-$TPS_n$ would have the reference voltage parameters PV1-PVn, the bit delay parameters PBD1-PBDn and the I/O ability parameters PIO1-PIOn, respectively.

After the TX calibration finishes, the controlling device 100 therefore can transmit data to the storage device 102 according to the optimized parameters (e.g. the predetermined parameter set PPS). However, the temperature and the power source voltage of the controlling device 100 may vary during the operations and the data transmission between the controlling device 100 and the storage device 102 may be affected. Thus, the controlling device 100 further performs a run-time TX calibration when the controlling device 100 transmits the data according to the predetermined parameter set PPS. For the purpose of not affecting the normal data transmissions between the controlling device 100 and the storage device 102, the run-time TX calibration of the controlling device 100 periodically transmits the calibration data CDAT according to at least one of run-time parameter sets $RPS_1$-$RPS_m$ and records error indicators $REI_1$-$REI_m$ corresponding to the run-time parameter sets $RPS_1$-$RPS_m$. The period of transmitting the calibration data CDAT according to the at least one of run-time parameter sets $RPS_1$-$RPS_m$ may be determined according to a refreshing period of the storage device 102. In an example, the period of performing the data transmission according to the at least one of run-time parameter sets $RPS_1$-$RPS_m$ can be set to be equaled to the refreshing period of the storage device 102 (e.g. 3.9 μs, 4 μs or 8 μs). After acquiring the error indicators $REI_1$-$REI_m$, the computing unit 110 adjusts the predetermined parameter set PPS according to the error indicators $REI_1$-$REI_m$ and the data transmission from the controlling device 100 to the storage device 102 would have the maximum margin.

In details, the run-time parameter sets $RPS_1$-$RPS_m$ may have parameter sets $PSI_1$-$PSI_k$, wherein at least one of parameters (e.g. reference voltage parameter, bit delay parameter, sampling parameter and I/O ability parameter) of the parameter sets $PSI_1$-$PSI_k$ is monotonically increased based on that of the predetermined parameter set PPS. In an example, the voltage values of the reference voltage VREFDQ corresponding to the parameter sets $PSI_1$-$PSI_k$ may be monotonically increased from the reference voltage VREFDQ corresponding to the parameter set $PSI_1$ to that corresponding to the parameter set $PSI_k$ and based on that of the predetermined parameter set PPS (i.e. VREFDQ of the parameter set $PSI_K$≥VREFDQ of the parameter set $PSI_{K-1}$≥ . . . ≥VREFDQ of the parameter set $PSI_1$≥VREFDQ of the predetermined parameter set PPS). According to the error indicators corresponding to the parameter sets $PSI_1$-$PSI_k$, the computing unit 110 acknowledges the upper boundary of successfully transmitting the data to the storage device 102.

On the other hand, the run-time parameter sets $RPS_1$-$RPS_m$ may have parameter sets $PSD_1$-$PSD_k$, wherein at least one of parameters (e.g. reference voltage parameter, bit delay parameter, sampling parameter and I/O ability parameter) of the parameter sets $PSD_1$-$PSD_k$ is monotonically decreased based on that of the predetermined parameter set PPS. In an example, the voltage values of the reference voltage VREFDQ corresponding to the parameter sets $PSD_1$-$PSD_k$ are monotonically decreased from the reference voltage VREFDQ parameter set $PSD_1$ to the parameter set $PSD_k$ and based on that of the predetermined parameter set PPS (i.e. VREFDQ of the parameter set $PSD_K$≤VREFDQ of the parameter set $PSD_{K-1}$≤ . . . ≤VREFDQ of the parameter set $PSD_1$≤VREFDQ of the predetermined parameter set PPS). According to the error indicators corresponding to the parameter sets $PSD_1$-$PSD_k$, the computing unit 110 acknowledges the lower boundary of successfully transmitting the data to the storage device 102.

After acquiring the upper boundary and the lower boundary of successfully transmitting the data to the storage device 102, the computing unit 110 can accordingly adjust the predetermined parameter set PPS.

In an example, the controlling device 100 is required to perform the run-time calibration on the reference voltage VREFDQ when transmitting the data to the storage device according to the predetermined parameter set PPS. First, the controlling device 100 defines the refreshing period of the storage device 102 as the period of transmitting the calibration data CDAT according to one of the run-time parameter set $RPS_1$-$RPS_m$. In this example, the voltage value of the reference voltage VREFDQ is monotonically increased from the run-time parameter set $RPS_1$ to the run-time parameter set $RPS_m$, and the voltage value of the reference voltage VREFDQ corresponding to the predetermined parameter set PPS is a median of those corresponding to the run-time parameter set $RPS_1$-$RPS_m$ (e.g. VREFDQ of the parameter set $RPS_1$≤VREFDQ of the parameter set $RPS_2$≤ . . . ≤VREFDQ of the parameter set $$RPS_{\frac{1+m}{2}-1} \leq VREFDQ$$

of the predetermined parameter set PPS≤VREFDQ of the parameter set $$RPS_{\frac{1+m}{2}} \leq \ldots \leq VREFDQ$$

of the parameter set $RPS_m$). Each time the storage device 102 performs the refreshing operation, the controlling device 100 transmits the calibration data CDAT to the storage device 102 according to one of the run-time parameter set $RPS_1$-$RPS_m$ and records the corresponded error indicators.

The sequence of acquiring the error indicators $REI_1$-$REI_m$ can be adjusted according to different application and design concepts. For example, the controlling device 100 periodically transmits the calibration data CDAT to the storage device 102 according to the sequence from the run-time parameter set $$RPS_{\frac{1+m}{2}}$$

to the run-time parameter set $RPS_m$ and sequentially acquires the error indicators $$REI_{\frac{1+m}{2}-1} - REI_1.$$

That is, the controlling device 100 may periodically transmit the calibration data CDAT to the storage device 102 according to the run-time parameter set $$RPS_{\frac{1+m}{2}}$$

when the storage device 102 performs the first refreshing operation and records the alert signal CRC as the error indicators $$REI_{\frac{1+m}{2}};$$

the controlling device 100 transmits the calibration data CDAT to the storage device 102 according to the run-time parameter set $$RPS_{\frac{1+m}{2}+1}$$

when the storage device 102 performs the second refreshing operation and records the alert signal CRC as the error indicators $$REI_{\frac{1+m}{2}+1};$$

and so on. Next, the controlling device 100 periodically transmits the calibration data CDAT to the storage device 102 according to the sequence from the run-time parameter set $$RPS_{\frac{1+m}{2}-1}$$

to the run-time parameter set $RPS_1$ and sequentially acquires the error indicators $$REI_{\frac{1+m}{2}-1} - REI_1.$$

After acquiring the error indicators $REI_1$-$REI_m$, the predetermined parameter set PPS can be adjusted according to the error indicators $REI_1$-$REI_m$. In this example, the error indicators $REI_1$-$REI_m$ indicate that the data transmissions of the run-time parameter sets $RPS_1$-$RPS_{k-1}$, and $RPS_{l+1}$-$RPS_m$ fail while the data transmissions of the run-time parameter sets $RPS_k$-$RPS_l$ success, the computing unit 110 may adjust the voltage value of the reference voltage VREFDQ corresponding to the predetermined parameter set PPS to that of the run-time parameter set $$RPS_{\frac{k+l}{2}},$$

so as to assure that the reference voltage VREFDQ has the maximum voltage margin.

According to different design concepts, the number of the run-time parameter set $RPS_1$-$RPS_m$ being tested each time the storage device 102 performs the refreshing operation may be changed. For example, each time the storage device 102 performs the refreshing operation, the controlling device 100 may transmit the calibration data CDAT respectively according to three of the run-time parameter set $RPS_1$-$RPS_m$, and is not limited herein.

Figure 2:
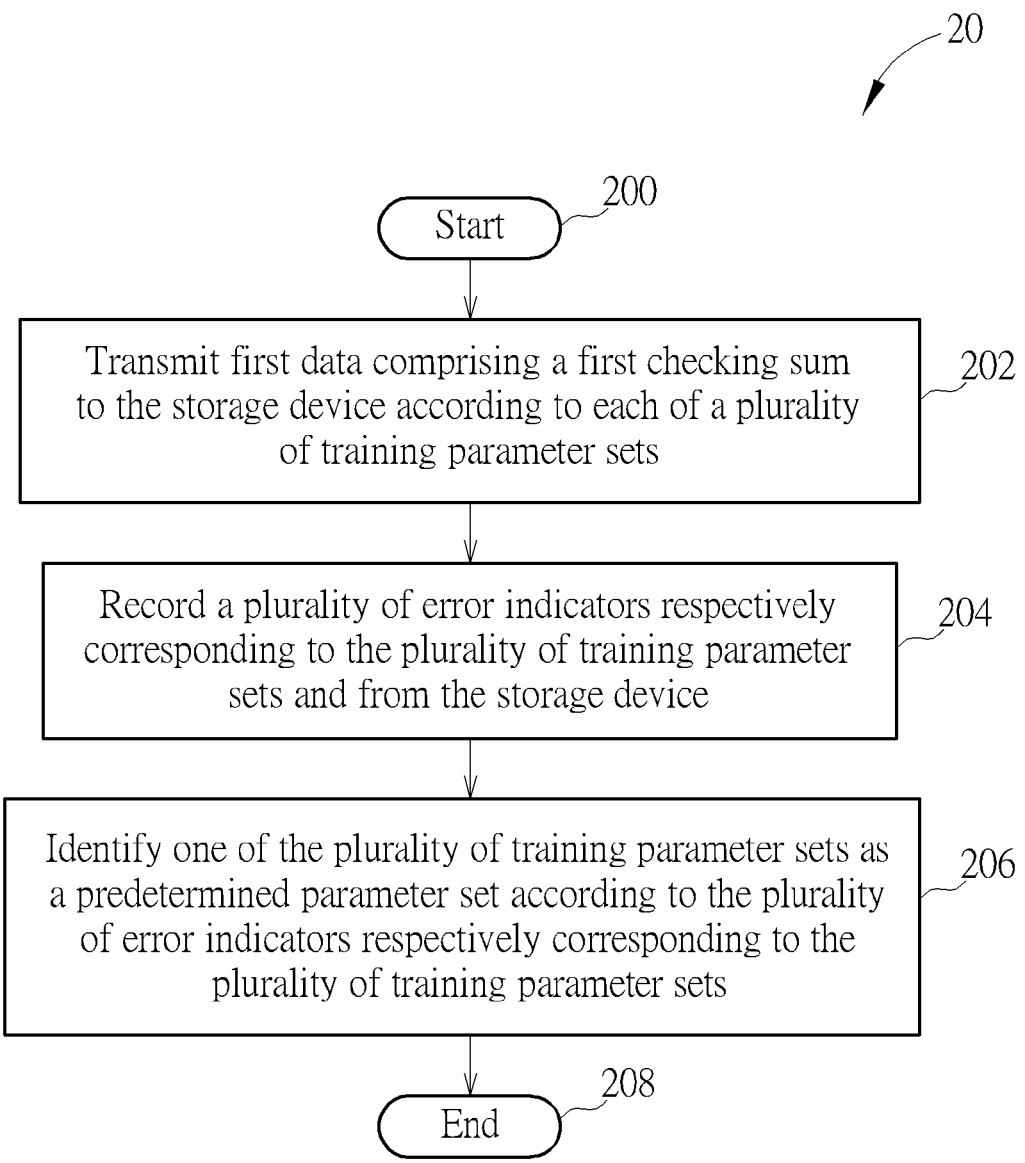
FIG. 2 is a flowchart of a calibration method for a controlling device of a storage device according to an example of the present invention.

The method that the controlling device 100 performs the TX calibration can be summarized into a calibration method 20 as shown in FIG. 2. The calibration method 20 may be utilized in a controlling device of a storage device, such as a DDR4 SDRAM. When the storage device is in an initialization stage, the controlling device 100 is required to perform the TX calibration. A transmission training function and a write checking function of the storage device need to be enabled before the controlling device performs the TX calibration. The calibration method 20 comprises the following steps:

Step 200: Start.

Step 202: Transmit first data comprising a first checksum to the storage device according to each of a plurality of training parameter sets.

Step 204: Record a plurality of error indicators respectively corresponding to the plurality of training parameter sets and from the storage device.

Step 206: Identify one of the plurality of training parameter sets as a predetermined parameter set according to the plurality of error indicators respectively corresponding to the plurality of training parameter sets.

Step 208: End.

According to the calibration method 20, the storage device receives the first data as testing data, generates a second checksum according to the testing data and compares the first checksum with the second checksum, to generate an alert signal to the controlling device as one of the plurality of error indicators. After recording all of the plurality of error indicators, the controlling device of the storage device may acquire the predetermined parameter set with the optimized parameters of data transmission. After the TX calibration finishes, the controlling device disables the transmission training function and decides to disable or not to disable the writing checking function according to the following operations. The details of the calibration method 20 can be referred to the above and is not narrated herein for brevity.

Figure 3:
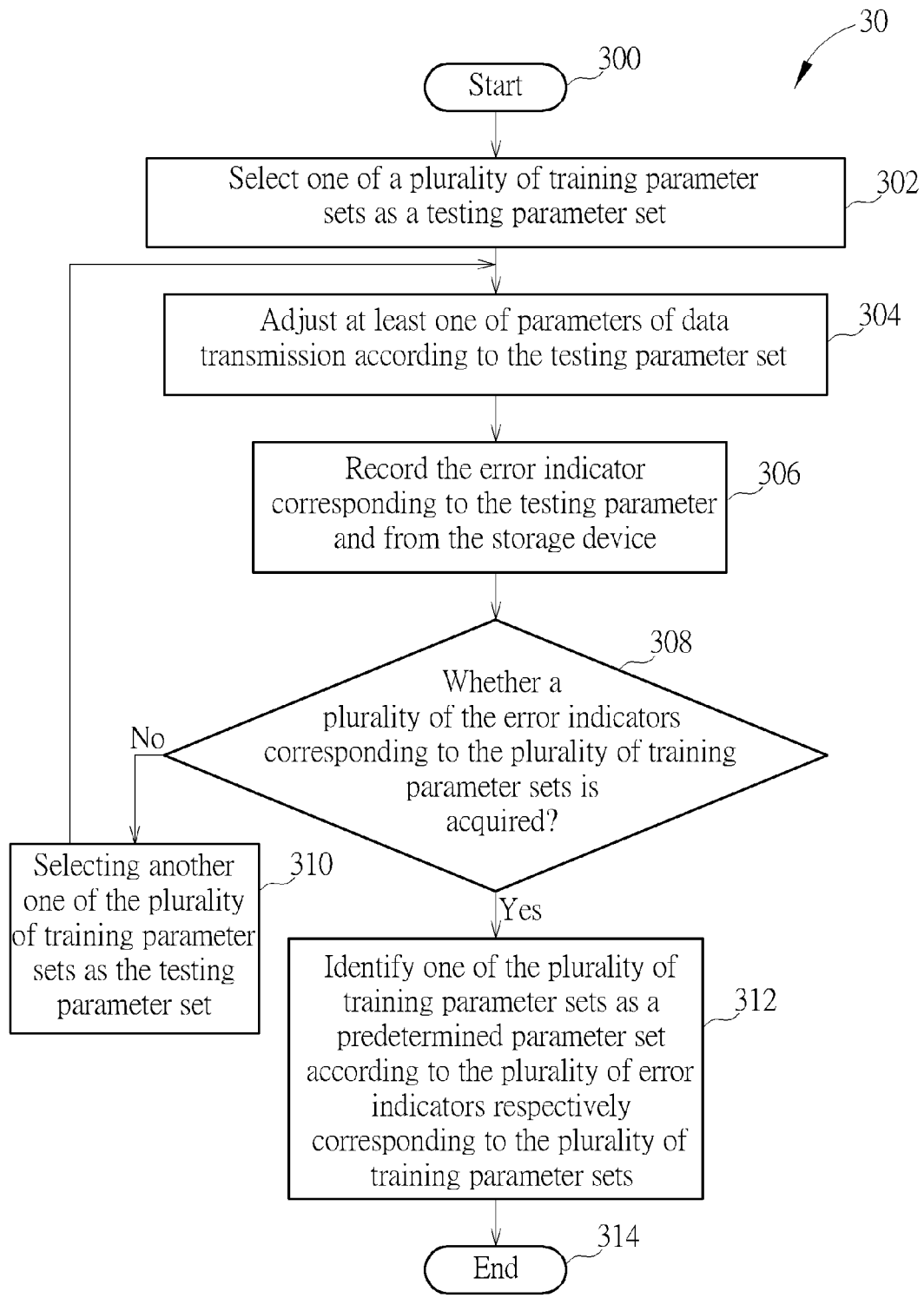
FIG. 3 is a flowchart of implementation of the calibration method shown in FIG. 2.

Please refer to FIG. 3, which is a flowchart of a calibration method 30 according to an example of the present invention. The calibration method 30 is an implementation of the calibration method 20 and comprises the following steps:

Step 300: Start.

Step 302: Select one of a plurality of training parameter sets as a testing parameter set.

Step 304: Adjust at least one of parameters of data transmission according to the testing parameter set.

Step 306: Record the error indicator corresponding to the testing parameter and from the storage device.

Step 308: Determine whether a plurality of the error indicators corresponding to the plurality of training parameter sets is acquired. If yes, proceed to step 312; otherwise, proceed to step 310.

Step 310: Select another one of the plurality of training parameter sets as the testing parameter set.

Step 312: Identify one of the plurality of training parameter sets as a predetermined parameter set according to the plurality of error indicators respectively corresponding to the plurality of training parameter sets.

Step 314: End.

According to the calibration method 30, the controlling device of the storage device may acquire the predetermined parameter set with the optimized parameters of data transmission. After the TX calibration finishes, the controlling device disables the transmission training function and decides to disable or not to disable the writing checking function according to the following operations. The details of the calibration method 30 can be referred to the above and is not narrated herein for brevity.

Figure 4:
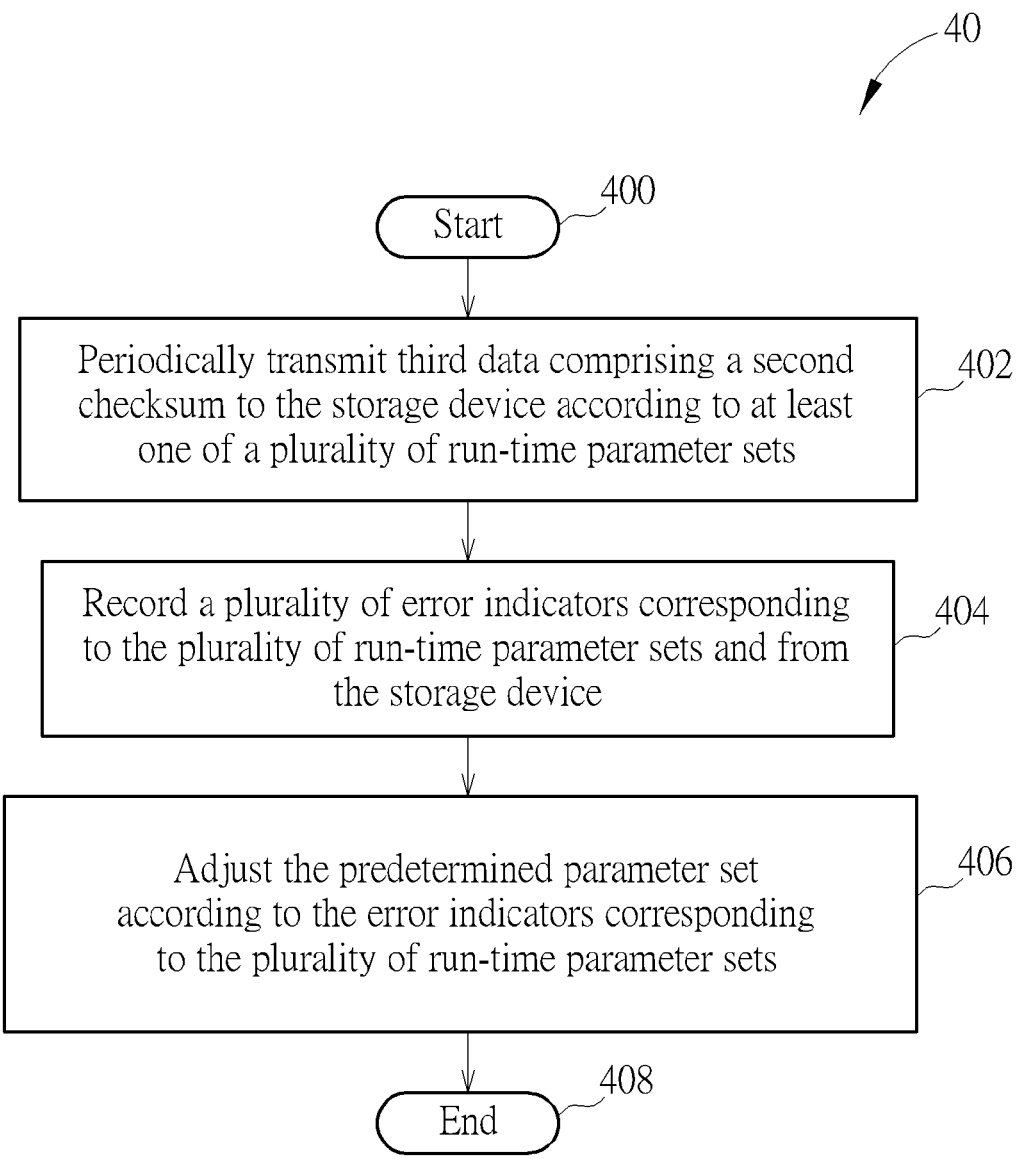
FIG. 4 is a flowchart of another calibration method for a controlling device of a storage device according to an example of the present invention.

The method that the controlling device 100 performs the run-time TX calibration can be summarized into a calibration method 40 as shown in FIG. 4. The calibration method 40 may be utilized in a controlling device of a storage device, such as DDR4 SDRAM. After the TX calibration in the initialization stage of the storage device (e.g. the calibration methods 20 or 30) finishes and the controlling device transmits the data to the storage device according to the predetermined parameter set with the optimized parameters, the controlling device performs the calibration method 40 for compensating variations of the operating conditions (e.g. variations of the power source voltage and the temperature). The calibration method 40 comprises the following steps:

Step 400: Start.

Step 402: Periodically transmit third data comprising a second checksum to the storage device according to at least one of a plurality of run-time parameter sets.

Step 404: Record a plurality of error indicators which are corresponding to the plurality of run-time parameter sets and from the storage device.

Step 406: Adjust the predetermined parameter set according to the error indicators corresponding to the plurality of run-time parameter sets.

Step 408: End.

According to the calibration method 40, the storage device periodically receives the third data with the second checksum as testing data; generates a receiver end checksum according to the testing data; and compares the second checksum and the receiver end checksum, for generating an alert signal to the controlling device as an error indicators corresponding to one of the run-time parameter sets. The predetermined parameter set therefore can be appropriately adjusted according to the variations generated during the operations when the controlling device performs the data transmission with the storage device according to the predetermined parameter set. The details of the calibration method 40 can be referred to the above, and are not described herein for brevity.

Figure 5:
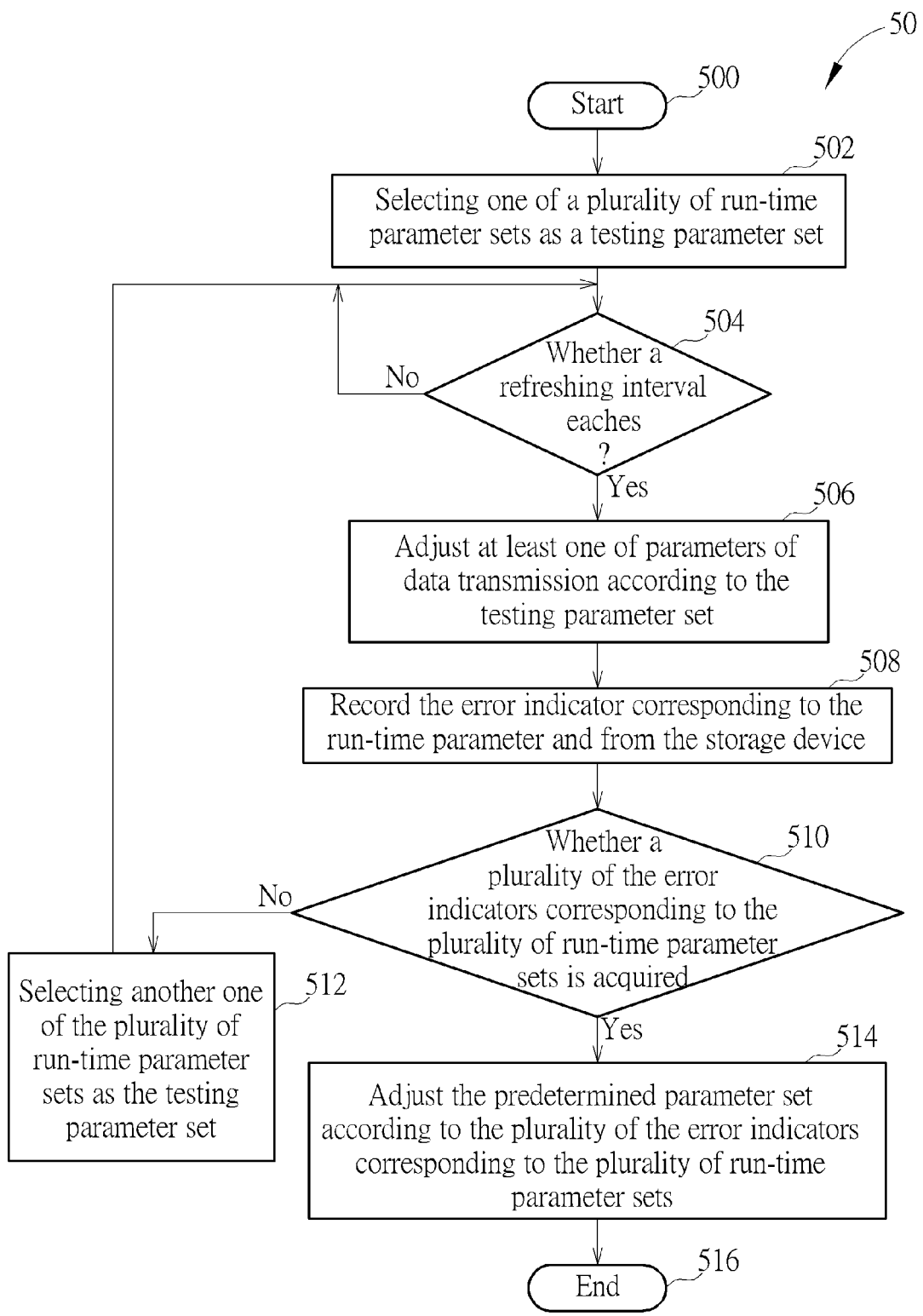
FIG. 5 is a flowchart of implementation of the calibration method shown in FIG. 4.

Please refer to FIG. 5, which is a flow chart of a calibration method 50 according to an example of the present invention. The calibration method 50 is an implementation of the calibration method 40 and comprises the following steps:

Step 500: Start.

Step 502: Select one of a plurality of run-time parameter sets as a testing parameter set.

Step 504: Determine whether a refreshing interval reaches. If yes, proceed to step 506; otherwise, proceed to step 504.

Step 506: Adjust at least one of parameters of data transmission according to the testing parameter set.

Step 508: Record the error indicator corresponding to the run-time parameter and from the storage device.

Step 510: Determine whether a plurality of the error indicators corresponding to the plurality of run-time parameter sets is acquired. If yes, proceed to step 514; otherwise, proceed to step 512.

Step 512: Select another one of the plurality of run-time parameter sets as the testing parameter set.

Step 514: Adjust the predetermined parameter set according to the plurality of the error indicators corresponding to the plurality of run-time parameter sets.

Step 516: End.

According to the calibration method 50, the predetermined parameter set may be appropriately adjusted according to the variations generated during the operations. The details of the calibration method 50 can be referred to the above, and are not described herein for brevity.

Figure 6:
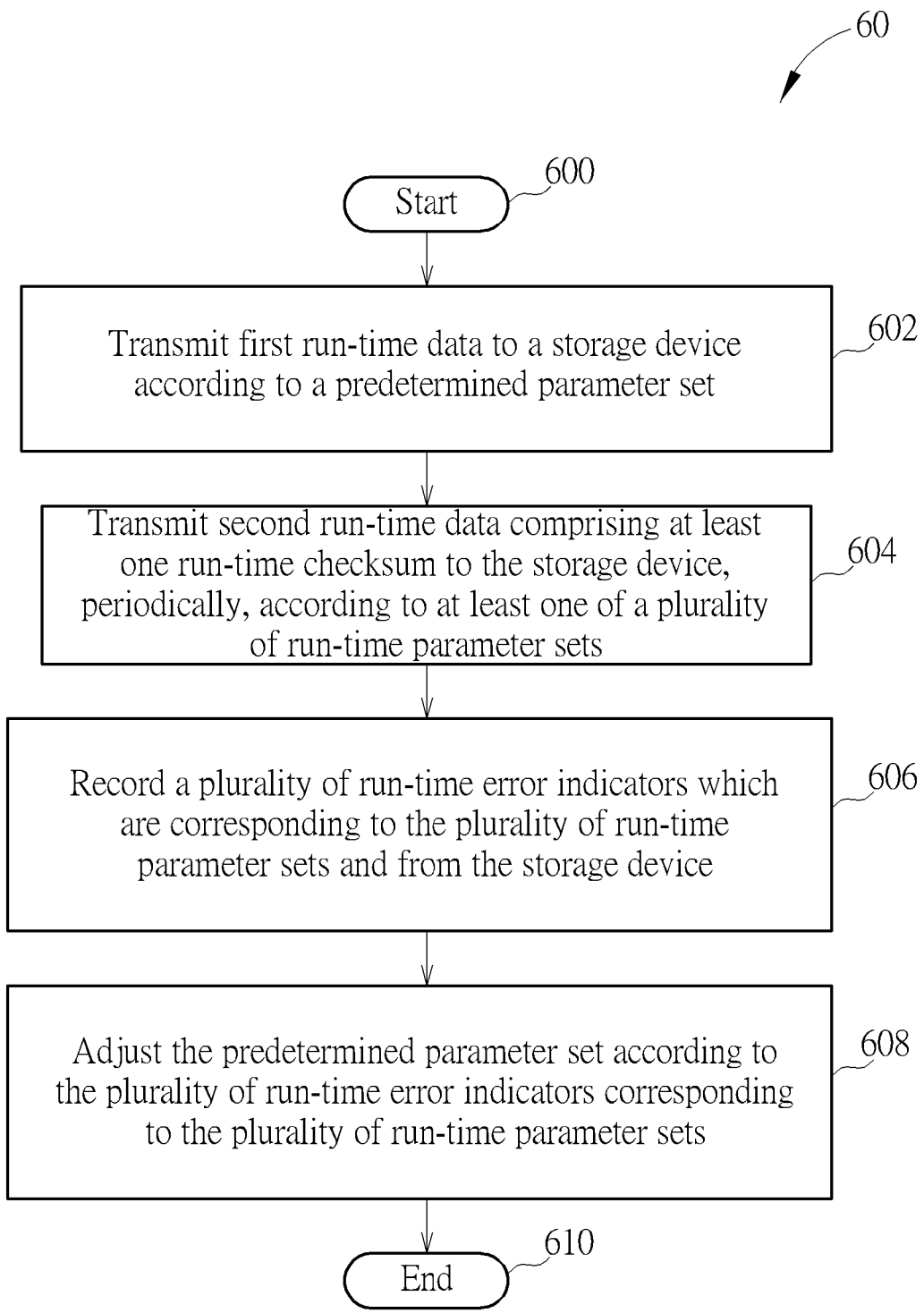
FIG. 6 is a flowchart of a calibration method for a storage device according to an example of the present invention.

Please refer to FIG. 6, which is a flowchart of a calibration method 60 according to an example of the present invention. The calibration method 60 may be utilized in a controlling device of a storage device (e.g. DDR4 SDRAM) and utilized for adjusting the transmission parameters while performing the data transmission with the storage device. The calibration method 60 comprises the following steps:

Step 600: Start.

Step 602: Transmit first run-time data to a storage device according to a predetermined parameter set.

Step 604: Transmit second run-time data comprising at least one run-time checksum to the storage device, periodically, according to at least one of a plurality of run-time parameter sets.

Step 606: Record a plurality of run-time error indicators which are corresponding to the plurality of run-time parameter sets and from the storage device.

Step 608: Adjust the predetermined parameter set according to the plurality of run-time error indicators corresponding to the plurality of run-time parameter sets.

Step 610: End.

According to the calibration method 60, when the controlling device of the storage device transmits the first run-time data according to the predetermined parameter set, the controlling device contiguously examines the variations of the operation conditions via periodically transmitting the second run-time data comprising at least one run-time checksum to the storage device according to at least one of a plurality of run-time parameter sets. In this example, the method of obtaining the predetermined set may be various according to different applications and design concepts. For example, the predetermined set may be preset in the controlling device and the controlling device transmits the data to the storage device according to the predetermined parameter set each time the storage device boots up; or, the predetermined set may be acquired via performing a TX calibration procedure which is executed when the storage device is in the initial stage.

Each time the storage device receives the second run-time data, the storage device generates an alert signal, according to a comparison between the run-time checksum and a receiver end run-time checksum, as a run-time error indicator corresponding to one of the plurality of run-time parameter sets. Note that, the receiver end run-time checksum is generated by the storage device based on the second run-time data. After recording the plurality of run-time error indicators which are corresponding to the plurality of run-time parameter sets and from the storage device, the controlling device accordingly adjusts transmission parameters (e.g. the parameters the period between the bits in the data signal transmitted to the storage device and/or the driving ability of the interface module of the controlling device) of the predetermined set. The controlling device therefore can compensate the variations of the operation conditions and avoid the data transmission from the controlling device and the storage device operates abnormally. The details of the calibration method 60 can be referred to the above, and are not described herein for brevity.

To sum up, the controlling device of the above embodiment performs the TX calibration without reading data from the storage device. The time of performing the TX calibration is shortened and the operations of the TX calibration would not be affected by results of RX calibrations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibration method for a controlling device of a storage device, the calibration method comprising:
   transmitting first data comprising a calibration data and a first checksum to the storage device according to each of a plurality of training parameter sets;
   recording a plurality of error indicators which are respectively corresponding to the plurality of training parameter sets and from the storage device; and
   identifying one of the plurality of training parameter sets as a predetermined parameter set according to the plurality of error indicators respectively corresponding to the plurality of training parameter sets;
   wherein each error indicator indicates whether transmitting the first data according to the corresponded training parameter set is successful.

2. The calibration method of claim 1, wherein the first checksum is generated according to the calibration data.

3. The calibration method of claim 1, wherein each training parameter set comprises at least one of a reference DQ voltage parameter, a bit delay parameter, a sampling strobe parameter and a controller I/O driving ability parameter.

4. The calibration method of claim 1, wherein each of the plurality of error indicators is generated by the storage device according to a comparison between the first checksum and a receiver end checksum, wherein the receiver end checksum is generated by the storage device based on the first data.

5. The calibration method of claim 1, wherein the step of identifying one of the plurality of training parameter sets as the predetermined parameter set is performed during an initialization of the storage device.

6. The calibration method of claim 1, wherein after the step of identifying one of the plurality of training parameter sets as the predetermined parameter set, the method further comprises:
   transmitting second data to the storage device according to the predetermined parameter set;
   periodically transmitting third data comprising at least one second checksum to the storage device according to at least one of a plurality of run-time parameter sets;
   recording a plurality of error indicators corresponding to the plurality of run-time parameter sets and from the storage device; and
   adjusting the predetermined parameter set according to the plurality of error indicators corresponding to the plurality of run-time parameter sets.

7. The calibration method of claim 6, wherein a period for periodically transmitting the third data to the storage device according to the at least one of the plurality of run-time parameter sets is determined according to a refreshing period of the storage device.

8. A calibration method for a controlling device of a storage device, the calibration method comprising:
   transmitting first run-time data to a storage device according to a predetermined parameter set;
   periodically transmitting second run-time data comprising at least one run-time checksum to the storage device according to at least one of a plurality of run-time parameter sets;
   recording a plurality of run-time error indicators which are corresponding to the plurality of run-time parameter sets and from the storage device; and
   adjusting the predetermined parameter set according to the plurality of run-time error indicators corresponding to the plurality of run-time parameter sets.

9. The calibration method of claim 8, wherein a period for periodically transmitting the second run-time data to the storage device according to the at least one of the plurality of run-time parameter sets is determined according to a refreshing period of the storage device.

10. The calibration method of claim 8, wherein the plurality of run-time parameter sets is acquired by monotonically decreasing the values of the parameters in the predetermined parameter set.

11. The calibration method of claim 8, wherein the plurality of run-time parameter sets is acquired by monotonically increasing the values of the parameters in the predetermined parameter set.

12. The calibration method of claim 8, wherein each of the plurality of run-time error indicators is generated by the storage device according to a comparison between the run-time checksum and a receiver end run-time checksum, wherein the receiver end run-time checksum is generated by the storage device based on the second run-time data.

13. A controlling device for a storage device, the controlling device comprising:
- an interface module, for transmitting data and signals between the controlling device and the storage device;
- a data providing module, for providing a first data comprising a calibration data and a first checksum; and
- a control module, for obtaining a plurality of training parameter sets;
- wherein the controlling device transmits, through the interface module, the first data comprising the calibration data and the first checksum to the storage device according to each of the plurality of training parameter sets;
- wherein the controlling device receives, through the interface module, a plurality of error indicators which are respectively corresponding to the plurality of training parameter sets, and each error indicator indicates whether transmitting the first data according to the corresponded training parameter set is successful;
- wherein the control module identifies one of the plurality of training parameter sets as a predetermined parameter set according to the plurality of error indicators.

14. The controlling device of claim 13, wherein each training parameter set comprises at least one of a reference DQ voltage parameter, a bit delay parameter, a sampling strobe parameter and a controller I/O driving ability parameter.

15. The controlling device of claim 13, wherein after the controlling device transmits second data to the storage device according to the predetermined parameter set, the controlling device periodically transmits third data comprising at least one second checksum to the storage device according to at least one of a plurality of run-time parameter sets; records a plurality of error indicators which are corresponding to the plurality of run-time parameter sets and from the storage device; and adjusts the predetermined parameter set according to the plurality of error indicators corresponding to the plurality of run-time parameter sets.

16. The controlling device of claim 15, wherein a period of the controlling device periodically transmits the third data comprising the at least one second checksum to the storage device according to the at least one of the plurality of run-time parameter sets is determined according to a refreshing period of the storage device.

17. The controlling device of claim 13, wherein the control module identifies one of the plurality of training parameter sets as the predetermined parameter during an initialization of the storage device.

* * * * *